United States Patent [19]

Overweg

[11] Patent Number: 5,245,306
[45] Date of Patent: Sep. 14, 1993

[54] ACTIVELY SHIELDED MAGNET FOR MAGNETIC RESONANCE APPARATUS

[75] Inventor: Johannes A. Overweg, Eindhoven, Netherlands

[73] Assignee: U.S. Philips Corp., New York, N.Y.

[21] Appl. No.: 957,537

[22] Filed: Oct. 5, 1992

[30] Foreign Application Priority Data

Oct. 3, 1991 [EP] European Pat. Off. ............ 91202584

[51] Int. Cl.$^5$ .................. G01V 3/00; H01F 7/00; H01F 5/00; G01R 33/40
[52] U.S. Cl. ..................... 335/299; 335/301; 324/319
[58] Field of Search .............. 335/296–306, 335/216; 324/318–320

[56] References Cited

U.S. PATENT DOCUMENTS

4,890,082 12/1989 Fujita .................. 335/301

FOREIGN PATENT DOCUMENTS

0160350 6/1985 European Pat. Off. .
0424600 2/1991 European Pat. Off. .

*Primary Examiner*—Leo P. Picard
*Assistant Examiner*—Raymond Barrera
*Attorney, Agent, or Firm*—Jack D. Slobod

[57] ABSTRACT

A magnet system for generating a uniform magnetic field in an examination zone (5) in an accommodation space of magnetic resonance apparatus is formed by a first, approximately cylindrical electromagnetic coil system (1) which encloses the examination zone and which is symmetrically arranged relative to a symmetry axis (9) and relative to a asymmetry plane (11) extending perpendicularly to the symmetry axis, and a second, approximately cylindrical electromagnetic coil system (7) which is arranged so as to be symmetrical relative to the symmetry axis and relative to the symmetry plane and which is arranged so as to be concentric with the first coil system, the magnetic dipole moments of the first and the second coil system being oppositely directed and substantially equal. The first coil system (1) includes a central coil (13) which is symmetrically arranged relative to the symmetry plane (11) and two pairs of further coils (15, 17) which are symmetrically arranged relative to the symmetry plane, the second coil system (7) including a central coil (21) symmetrically arranged relative to the symmetry plane and a pair of further coils (23) symmetrically arranged relative to the symmetry plane. As a result, despite the use of only eight coils the magnet system generates a highly uniform central magnetic field and only a very small stray field.

4 Claims, 3 Drawing Sheets

ACTIVELY SHIELDED MAGNET FOR MAGNETIC RESONANCE APPARATUS

BACKGROUND OF THE INVENTION

1. Field of the Invention

The invention relates to an actively shielded, comprising a magnet system for generating a uniform magnetic field in an examination zone within an accommodation space of a magnetic resonance apparatus, said magnet system being formed of concentric first and second cylindrical coil systems which enclose the accommodation space, and which have respective magnetic dipole moments that are oppositely directed and substantially equal.

2. Description of the Related Art

An example of an apparatus of the kind set forth is known from DE-A-3 829 175. The magnet system serves to generate a very uniform magnetic field in the examination zone, the magnetic flux density in the examination zone amounting to, for example more than 1 tesla with an inhomogeneity of no more than a few ppm, the external magnetic stray field being as small as possible, for example less than 500 $\mu T$ at a distance of a few meters from the magnet system. In a magnetic resonance (MR) apparatus of the kind set forth, the external magnetic field generated by the second coil system offers a substantial compensation for the external magnetic field of the first coil system, so that on the one hand the resultant external magnetic field is strongly reduced and on the other hand an external influencing of the stray field hardly has any effect on the uniformity of the field within the examination zone; in this respect see also EP-A-3 138 270 (PHN 10,800). The first and the second coil system preferably consist of superconducting coils.

The cited document DE-A-3 829 175 explains that in order to achieve an acceptable uniformity of the magnetic field in the examination zone, the first coil system should consist of three pairs of coils which are symmetrically arranged relative to the symmetry plane. The second coil system in the known apparatus consists of two pairs of coils which are symmetrically arranged relative to the symmetry plane. The total number of coils required thus amounts to ten. It would be desirable to reduce the number of coils because on the one hand, as explained in DE-A-3 829 175, the manufacturing precision decreases as the number of coils is greater and because on the other hand the manufacturing costs increase as the number of coils is greater.

It is an object of the invention to provide a magnetic resonance apparatus of the kind set forth in which the number of coils required is smaller than in the known apparatus, the magnetic field in the examination zone nevertheless being at least equally uniform. To achieve this, the apparatus in accordance with the invention is characterized in that the first coil system comprises a central coil which is symmetrically arranged relative to the symmetry plane and two pairs of further coils which are symmetrically arranged relative to the symmetry plane, the second coil system comprising a central coil which is symmetrically arranged relative to the symmetry plane and a pair of further coils which is symmetrically arranged relative to the symmetry plane. The invention is based on the recognition of the fact that, when a part of the turns of the second coil system is concentrated in a central coil which is symmetrically arranged relative to the symmetry plane, the number of coils in the first coil system can be reduced to five without causing a loss of uniformity of the magnetic field in the examination zone. The total number of coils in the magnet system can thus be reduced to eight.

It has been found that the further coils of the second coil system are preferably arranged so far outside the symmetry plane that the axial dimensional of the second coil system is substantially equal to that of the first coil system.

BRIEF DESCRIPTION OF THE DRAWING

These and other aspects of the invention will be described in detail hereinafter with reference to the drawing wherein.

DETAILED DESCRIPTION OF THE PREFERRED EMBODIMENTS

Figure 1:
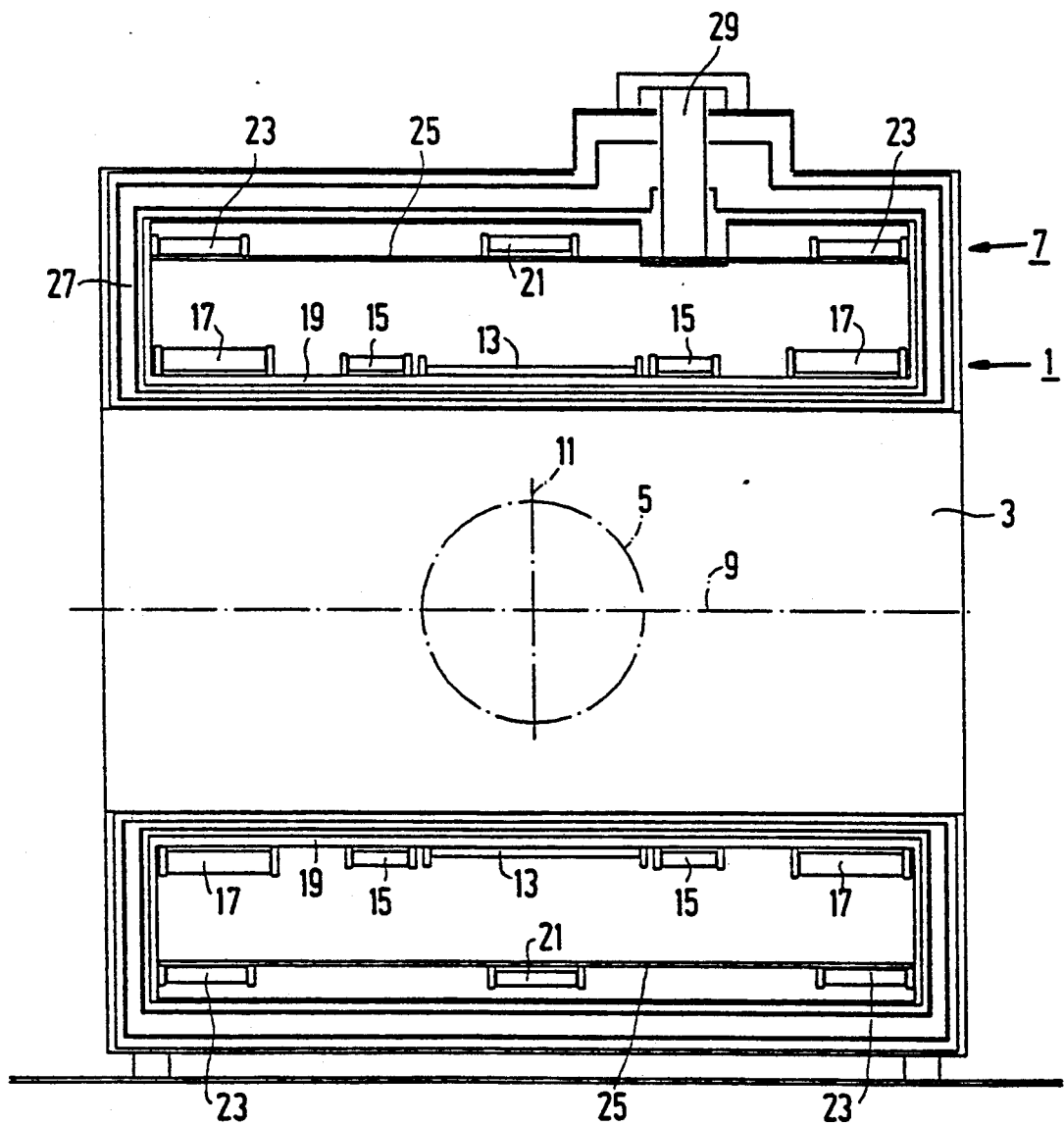
FIG. 1 is a longitudinal sectional view of an embodiment of a magnet system in accordance with the invention.

The magnet system shown in FIG. 1 may form part of an MR apparatus, for example as described in EP-A-138 270. It comprises a first, approximately cylindrical, electromagnetic coil system 1 which encloses an also approximately cylindrical accommodation space 3, an approximately spherical central portion of which (denoted by a dash-dot line) serves as an examination zone 5. A patient (not shown) can be introduced into the accommodation space 3, so that a part of the body of the patient to be examined is situated in the examination zone 5 whose diameter is, for example approximately 50 cm. The first coil system 1 is concentrically enclosed by a second, approximately cylindrical coil system 7. Said coil systems 1, 7 and the accommodation space 3 are arranged rotationally symmetrically relative to a symmetry axis 9, denoted by a dash-dot line, and are also symmetrical relative to a symmetry plane which extends perpendicularly to the symmetry axis and is denoted by a dash-dot line 11.

The first coil system comprises a central coil 13, a first pair of further coils 15, and a second pair of further coils 17. The central coil 13 is symmetrically arranged relative to the symmetry plane 11, which means that the parts of this coil which are situated to both sides of the symmetry plane comprise the same numbers of turns and are a mirror image of one another in respect of shape and distribution of the turns. Each of the pairs of further coils 15 and 17 is symmetrically arranged relative to the symmetry plane 11, the former further coils 15 being situated nearer to this plane than the latter further coils 17. The coils 13, 15, 17 of the first coil system 1 are accommodated on a first common support 19. The second coil system 7 comprises a central coil 21 and a pair of further coils 23. The central coil 21 as well as the pair of further coils 23 are symmetrically arranged relative to the symmetry plane 11. The coils 21, 23 of the second coil system 7 are accommodated on a second common support 25.

The two coil systems 1, 7 are accommodated in a dewar vessel 27 which can be filled, via an opening 29, with a suitable cooling liquid, for example liquid helium. The coils constituting the coil systems 1, 7 are made of a material which is superconducting at the temperature of the cooling liquid. However, it is alternatively possible to construct the two coil systems 1, 7 by means of resistive coils.

Figure 2:
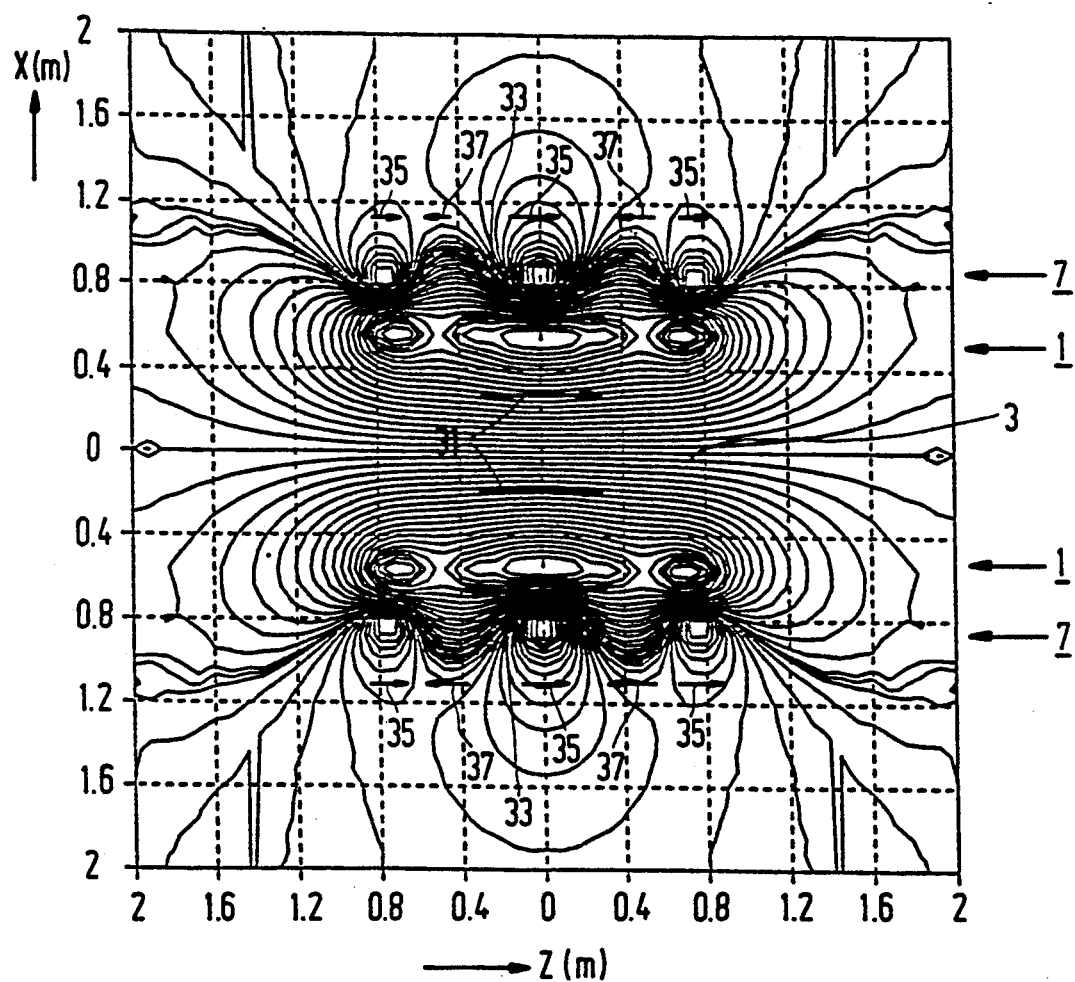
FIG. 2 is a diagram illustrating the course of the magnetic lines of force in the magnet system shown in FIG. 1.

FIG. 2 shows diagrammatically the course of the magnetic lines of force in and in the direct vinicity of the magnet system shown in FIG. 1. The location of the first and the second coil systems 1 and 7 is indicated at the right-hand side of FIG. 2. The Figure shows coordinate directions Z and X which extend parallel to the symmetry axis 9 and in a direction perpendicular thereto, respectively. The Z coordinate of the symmetry plane 11 is Z=0. The magnetic dipole moments of the two coil systems are opposed and substantially equal. The principal direction of the magnetic field within the first coil system 1 (in the accommodation space 3) is denoted by arrows 31. The principal direction of the magnetic field in the space between the first coil system 1 and the second coil system 7 opposes the former principal direction as denoted by the arrows 33. Directly outside the coils 21, 23 of the second coil system 7 the magnetic field has substantially the same direction as within the first coil system 1, see the arrows 35. In the regions between the coils 21 and 23 of the second coil system 7 and immediately outside these coils the magnetic field of the first coils system 1, oriented in accordance with the arrows 33, is predominant as indicated by the arrows 37. The stray field (at some distance from the second coil system 7), therefore, behaves as the stray field of a succession of identical coils of alternating polarity. The magnetic field of such a configuration has the property that it very quickly decreases in the radial direction as appears from FIG. 3.

Figure 3:
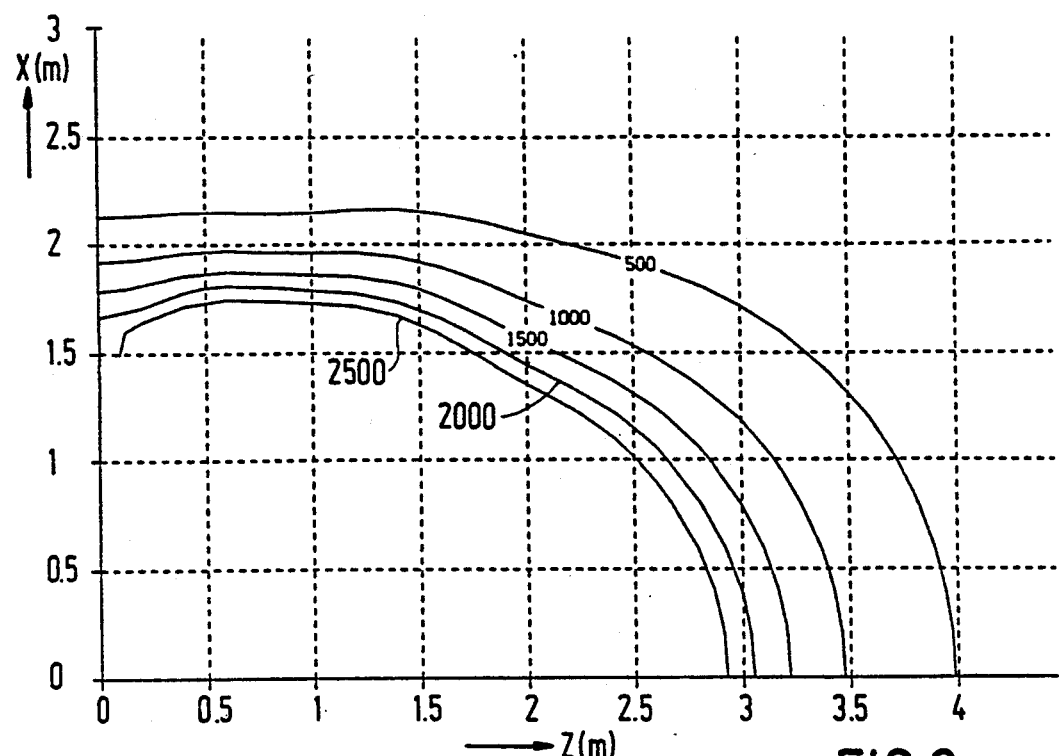
FIG. 3 is a diagram illustrating the course of a number of lines of equal magnetic induction outside the magnet system shown in FIG. 1.

The diagram of FIG. 3 shows a number of lines of equal magnetic induction in a quadrant of the X-Z plane (X>0 and Z>0). The magnetic induction associated with the lines is given in $\mu T$. In the presence of a main field amounting to approximately 1.5 T in the examination space 5 and for a diameter of the first coil system 1 amounting to approximately 1800 mm, the stray field has a value of less than 500 $\mu T$ at a distance of 2.2 m from the symmetry axis 9 (measured in the radial direction) and at a distance of almost 4 m from the symmetry plane 11 (measured in the axial direction).

Figure 4:
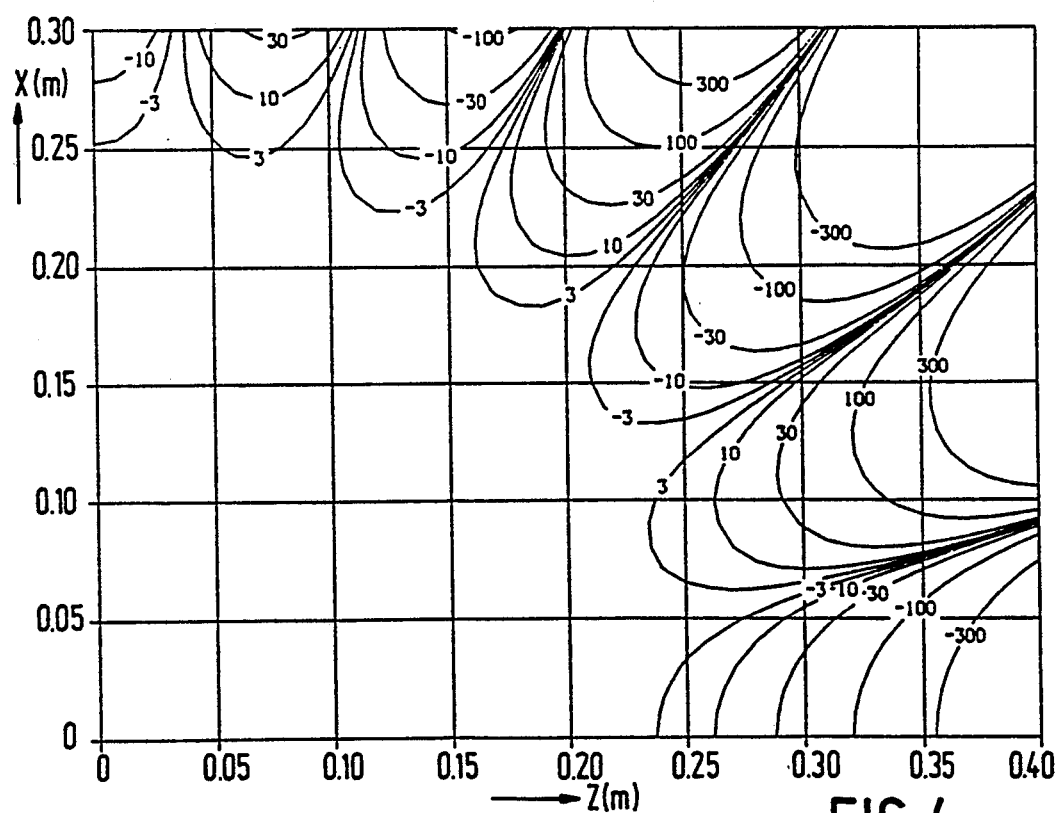
FIG. 4 is a diagram illustrating the course of a number of lines of equal magnetic induction within the magnet system shown in FIG. 1.

FIG. 4 shows that the magnetic field inside the examination space 5 is highly uniform. The Figure again shows a quadrant (X>0, Z>0) of the X-Z plane with lines of equal magnetic induction, the values stated near the lines being the deviations, measured in $\mu T$, from the main field of 1.5 T. It will be evident that the deviations will be no more than a few ppm within a sphere having a radius of approximately 25 cm.

I claim:

1. A magnet system for generating a uniform magnetic field in an examination space (5), said magnet system comprising an approximately cylindrical, electromagnetic coil system (1) which consists of more than one coil and which encloses the examination space, which coil system is symmetrically arranged relative to a symmetry axis (9) and relative to a symmetry plane (11) extending transversely to the symmetry axis, and also comprising a second, approximately cylindrical electromagnetic coil system (7) which consists of more than one coil and which is symmetrically arranged relative to the symmetry axis and relative to the symmetry plane, said second system being arranged so as to be concentric with the first coil system, the magnetic dipole moments of the first and the second coil system being oppositely directed and substantially equal, characterized in that the first coil system (1) comprises a central coil (13) which is symmetrically arranged relative to the symmetry plane (11) and two pairs of further coils (15, 17) which are symmetrically arranged relative to the symmetry plane, the second coil system (7) comprising a central coil (21) which is symmetrically arranged relative to the symmetry plane and a pair of further coils (23) which is symmetrically arranged relative to the symmetry plane.

2. A magnet system as claimed in claim 1, characterized in that an extent of the second coil system (7) along the symmetry axis is substantially equal to that of the first coil system (1).

3. A magnetic resonance apparatus comprising a magnet system as claimed in claim 1.

4. A magnetic resonance apparatus comprising a magnet system claimed in claim 2.

* * * * *